United States Patent
Choung et al.

(10) Patent No.: US 9,293,565 B2
(45) Date of Patent: Mar. 22, 2016

(54) ETCHANT COMPOSITION AND METHOD OF MANUFACTURING METAL WIRING AND THIN FILM TRANSISTOR SUBSTRATE USING THE ETCHANT

(71) Applicants: Samsung Display Co., Ltd., Yongin, Gyeonggi-Do (KR); DONGWOO FINE-CHEM Co., Ltd., Iksan, Jeonrabuk-Do (KR)

(72) Inventors: Jong-Hyun Choung, Yongin (KR); In-Bae Kim, Yongin (KR); Jae-Woo Jeong, Yongin (KR); Hong-Sick Park, Yongin (KR); In-Seol Kuk, Iksan (KR); Gi-Yong Nam, Iksan (KR); Young-Chul Park, Iksan (KR); In-Ho Yu, Iksan (KR); Young-Jin Yoon, Iksan (KR); Suck-Jun Lee, Iksan (KR)

(73) Assignees: SAMSUNG DISPLAY CO., LTD. (KR); DONGWOO FINE-CHEM CO., LTD. (KR)

( * ) Notice: Subject to any disclaimer, the term of this patent is extended or adjusted under 35 U.S.C. 154(b) by 51 days.

(21) Appl. No.: 14/100,124

(22) Filed: Dec. 9, 2013

(65) Prior Publication Data
US 2015/0004758 A1    Jan. 1, 2015

(30) Foreign Application Priority Data
Jun. 27, 2013    (KR) .................. 10-2013-0074896

(51) Int. Cl.
| | | |
|---|---|---|
| *H01L 29/66* | (2006.01) | |
| *C09K 13/08* | (2006.01) | |
| *H01L 21/3213* | (2006.01) | |
| *C23F 1/02* | (2006.01) | |
| *C23F 1/18* | (2006.01) | |
| *C23F 1/26* | (2006.01) | |
| *H01L 29/45* | (2006.01) | |
| *H01L 29/49* | (2006.01) | |
| *H01L 27/32* | (2006.01) | |

(52) U.S. Cl.
CPC .......... *H01L 29/66742* (2013.01); *C09K 13/08* (2013.01); *C23F 1/02* (2013.01); *C23F 1/18* (2013.01); *C23F 1/26* (2013.01); *H01L 21/32134* (2013.01); *H01L 29/458* (2013.01); *H01L 29/4908* (2013.01); *H01L 27/3276* (2013.01)

(58) Field of Classification Search
None
See application file for complete search history.

(56) References Cited

U.S. PATENT DOCUMENTS

| | | |
|---|---|---|
| 4,859,281 A | 8/1989 | Goltz |
| 5,700,389 A | 12/1997 | Nakagawa |
| 6,746,621 B2 | 6/2004 | Kurii et al. |

(Continued)

FOREIGN PATENT DOCUMENTS

| | | |
|---|---|---|
| JP | 2012-140651 A | 7/2012 |
| KR | 1020040011855 A | 2/2004 |

(Continued)

*Primary Examiner* — Michael Jung
(74) *Attorney, Agent, or Firm* — Cantor Colburn LLP

(57) ABSTRACT

An etchant composition includes about 0.5 weight % to about 20 weight % of persulfate, about 0.01 weight % to about 2 weight % of a fluoride compound, about 1 weight % to about 10 weight % of an inorganic acid, about 0.5 weight % to about 5 weight % of a cyclic amine compound, about 0.1 weight % to about 10.0 weight % of a compound having an amino group and a sulfonic acid, about 0.1 weight % to about 15.0 weight % of an organic acid or a salt thereof, and water to 100 weight % of the etchant composition.

18 Claims, 11 Drawing Sheets

(56) References Cited

U.S. PATENT DOCUMENTS

| | | |
|---|---|---|
| 7,800,296 B2 | 9/2010 | Shin |
| 7,888,148 B2 | 2/2011 | Park et al. |
| 7,951,653 B1 | 5/2011 | Park et al. |
| 2008/0073614 A1* | 3/2008 | Akiyama et al. ............. 252/79.3 |
| 2010/0216315 A1* | 8/2010 | Yaguchi et al. ................ 438/745 |
| 2012/0208310 A1 | 8/2012 | Kim et al. |
| 2012/0319033 A1* | 12/2012 | Okabe et al. ................. 252/79.4 |
| 2012/0322187 A1 | 12/2012 | Choung et al. |
| 2013/0115733 A1 | 5/2013 | Kim et al. |
| 2014/0014952 A1* | 1/2014 | Katsui et al. .................... 257/43 |
| 2014/0024206 A1 | 1/2014 | Kim et al. |

FOREIGN PATENT DOCUMENTS

| | | |
|---|---|---|
| KR | 1020120138290 A | 12/2012 |
| KR | 1020130016068 A | 2/2013 |
| KR | 1020130050829 A | 5/2013 |

* cited by examiner

ETCHANT COMPOSITION AND METHOD OF MANUFACTURING METAL WIRING AND THIN FILM TRANSISTOR SUBSTRATE USING THE ETCHANT

This application claims priority to and the benefit of Korean Patent Application No. 10-2013-0074896, filed on Jun. 27, 2013, and all the benefits accruing therefrom under 35 U.S.C. §119, the content of which is incorporated herein in its entirety by reference.

BACKGROUND

1. Field

The embodiments of the present invention relate to an etchant composition, and to a method of manufacturing a metal wiring using the etchant composition, and a method of manufacturing a thin film transistor (TFT) using the metal wiring.

2. Description of the Related Art

In general, a thin film transistor (TFT) substrate is used as a circuit board for independently driving each pixel in a liquid crystal display (LCD) apparatus or an organic light emitting display (OLED) apparatus. The TFT substrate includes gate wiring, data wiring, and a TFT connected to both the gate wiring and the data wiring.

The various wirings and electrodes of the TFT substrate are formed using a patterning process, such as a photolithography method.

The patterning process includes an etching step. However, it is not easy to manufacture wirings using an etching process, as there are limitations in forming wirings having the desired properties.

SUMMARY

The embodiments disclosed herein provide an etchant composition having improved etching properties with respect to metal wirings, a method of forming the metal wirings by using the etchant composition, and a method of manufacturing a thin film transistor (TFT) substrate.

According to an embodiment, there is provided an etchant composition including: 0.5 weight % to about 20 weight % of persulfate, 0.01 weight % to 2 weight % of a fluoride compound, 1 weight % to 10 weight % of an inorganic acid, 0.5 weight % to 5 weight % of a cyclic amine compound, 0.1 weight % to 10.0 weight % of a compound having an amino group and a sulfonic acid, 0.1 weight % to 15.0 weight % of an organic acid or a salt thereof, and water to a total of 100 weight % of the etchant composition, wherein the weight percents are based on a total weight of the etchant composition.

The persulfate may be at least one of potassium persulfate ($K_2S_2O_8$), sodium persulfate ($Na_2S_2O_8$), and ammonium persulfate (($NH_4$)$_2S_2O_8$).

The fluoride compound may be at least one of ammonium fluoride, sodium fluoride, potassium fluoride, ammonium bifluoride, sodium bifluoride, and potassium bifluoride.

The inorganic acid may be at least one of nitric acid, sulphuric acid, phosphoric acid, and perchloric acid.

The cyclic amine compound may be at least of one of aminotetrazole, imidazole, indole, purine, pyrazole, pyridine, pyrimidine, pyrrole, pyrrolidine, and pyrroline.

The compound having an amino group and the sulfonic acid group is expressed by the following chemical formula 1:

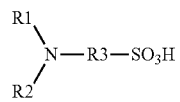

Formula 1 where R1 and R2 are independently a hydrogen, or a C1 to C3 alkyl group, and R3 is a bond or a C1 to C3 alkylene group.

The compound having the amino group and the sulfonic acid group may be at least one of sulfamic acid and aminoethanesulfonic acid.

The organic acid or a salt thereof may be at least one of carboxylic acid, dicarboxylic acid or tricarboxylic acid, and tetracarboxylic acid, and the organic salt is a potassium salt, a sodium salt, and an ammonium salt of the organic acid.

The organic acid or a salt thereof may be at least one of acetic acid, butanoic acid, citric acid, formic acid, gluconic acid, glycolic acid, malonic acid, oxalic acid, pentanoic acid, sulfobenzoic acid, sulfosuccinic acid, sulfophthalic acid, salicylic acid, sulfosalicylic acid, benzoic acid, lactic acid, glyceric acid, succinic acid, malic acid, tartaric acid, isocitric acid, propenoic acid, iminodiacetic acid, and ethylenediaminetetraacetic acid (EDTA), and the organic acid salts is a potassium salt, a sodium salt, or an ammonium salt of the organic acid.

The etchant composition may be used to etch a multi-layer structure formed of copper and titanium.

According to another aspect, there is provided a method of fabricating a metal wiring, the method including: forming a metal layer including copper and titanium on a substrate; forming a photosensitive layer pattern on the metal layer; etching a portion of the metal layer with an etchant composition, wherein the photosensitive layer pattern acts as a mask; and removing the photosensitive layer pattern, wherein the etchant composition includes: 0.5 weight % to about 20 weight % of persulfate, 0.01 weight % to 2 weight % of a fluoride compound of, 1 weight % to 10 weight % of an inorganic acid, 0.5 weight % to 5 weight % of a cyclic amine compound, 0.1 weight % to 10.0 weight % of a compound having an amino group and a sulfonic acid, 0.1 weight % to 15.0 weight % of an organic acid or a salt thereof, and water to a total of 100 weight % of the etchant composition, wherein the weight percents are based on the total weight of the etchant composition.

The metal layer may include a first metal layer formed of titanium and a second metal layer formed of copper, wherein the second metal layer is formed on the first metal layer.

The persulfate may be at least one of potassium persulfate ($K_2S_2O_8$), sodium persulfate ($Na_2S_2O_8$), and ammonium persulfate (($NH_4$)$_2S_2O_8$).

The inorganic acid may be at least one of nitric acid, sulphuric acid, phosphoric acid, and perchloric acid.

The cyclic amine compound may be one at least one of aminotetrazole, imidazole, indole, purine, pyrazole, pyridine, pyrimidine, pyrrole, pyrrolidine, and pyrroline.

The compound having an amino group and a sulfonic acid group may be format least one of sulfamic acid and aminoethanesulfonic acid.

The organic acid may be at least one of a carboxylic acid, a dicarboxylic acid or tricarboxylic acid, and a tetracarboxylic acid, and the organic acid salt is a potassium salt, a sodium salt, and an ammonium salt of the organic acid.

The organic acid may be at least one of acetic acid, butanoic acid, citric acid, formic acid, gluconic acid, glycolic acid, malonic acid, oxalic acid, pentanoic acid, sulfobenzoic acid, sulfosuccinic acid, sulfophthalic acid, salicylic acid, sulfosalicylic acid, benzoic acid, lactic acid, glyceric acid, succinic acid, malic acid, tartaric acid, isocitric acid, propenoic acid, iminodiacetic acid, and ethylenediaminetetraacetic acid (EDTA), and the organic acid salt is a potassium salt, a sodium salt, or an ammonium salt of the organic acids.

According to another aspect, there is provided a method of making a thin film transistor (TFT) substrate, the method including: forming a gate line on a substrate and a gate electrode connected to the gate line, wherein the gate line extends in a first direction; forming a data line which extends in a second direction, a source electrode connected to the data line, and a drain electrode separated from the source electrode, wherein the data line crosses the gate line; and forming a pixel electrode connected to the drain electrode, wherein the forming of the gate line and the gate electrode connected to the gate line includes: forming a metal layer including copper and titanium on a substrate; forming a photosensitive layer pattern on the metal layer, and etching a portion of the metal layer with an etchant composition, wherein the photosensitive layer pattern acts as a mask; and removing the photosensitive layer pattern, wherein the etchant composition includes: about 0.5 weight % to about 20 weight % of persulfate, 0.01 weight % to 2 weight % of a fluoride compound, 1 weight % to 10 weight % of an inorganic acid, 0.5 weight % to 5 weight % of a cyclic amine compound, 0.1 weight % to 10.0 weight % of a compound having an amino group and a sulfonic acid, 0.1 weight % to 15.0 weight % of an organic acid or salts thereof, and water to a total of 100 weight % of the etchant composition, wherein all weight percents are based on a total weight of the etchant composition.

The metal layer may include a first metal layer formed of titanium and a second metal layer formed of copper, wherein the second metal layer is formed on the first metal layer.

BRIEF DESCRIPTION OF THE DRAWINGS

The above and other features and advantages of the present invention will become more apparent by describing in further detail exemplary embodiments thereof with reference to the attached drawings in which.

DETAILED DESCRIPTION

Figure 1:
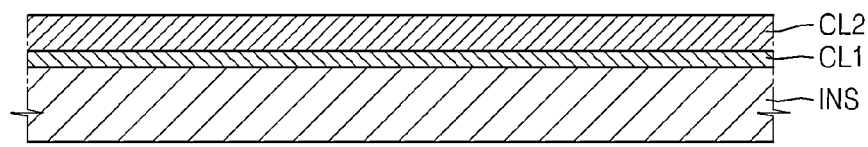
FIGS. 1 through 5 are cross-sectional views illustrating exemplary embodiments of processes of forming a metal wiring by using an etchant composition according to the present invention.

Embodiments of the present invention will be described below in more detail with reference to the accompanying drawings.

It will be understood that: i) shapes, sizes, ratios, angles, numbers, operations, and the like shown in the accompanying drawings are merely examples and may vary, ii) the drawings are illustrated from the perspective of an observer, and thus directions and locations may vary based on the location of the observer, and iii) that like reference numerals refer to like elements throughout.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

It will be further understood that the terms such as "comprises" and/or "comprising", "includes" and/or "including," and "having," when used in this specification, specify the presence of stated features, regions, integers, steps, operations, elements, and/or components, but do not preclude the presence or addition of one or more other features, regions, integers, steps, operations, elements, components and/or groups thereof. Further, the term "consist of" and/or "consisting of" may be intended to indicate a plurality of components unless the terms are used in conjunction with the term "only".

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value. It shall also be understood that variations are possible in relation to descriptions regarding numbers, shapes, size comparisons, position relationships when the descriptions are given without the terms "about," "substantially," "relatively," or the like. It will be understood that terms such as "after," "before," "next," "and then," "here," "following," and the like, shall be understood as not limiting chronological positions.

It will also be understood that in the case where a positional relationship between two items is described with spatially relative term such as "beneath," "below," "lower," "above," "upper," "on," "on the top of," or the like, one or more items may be interposed therebetween unless a description is given in conjunction with the term "directly.". It will also be understood that the spatially relative terms may be used herein for ease of description to describe one element or feature's relationship to another element(s) or feature(s) as illustrated in the figures. It will be understood that spatially relevant terms are intended to encompass different orientations of the device in use or operation in addition to the orientation depicted in the figures. For example, if the device in the figures is turned over, elements described as "below" or "beneath" other elements or features would then be oriented "above" the other elements or features. The device may be otherwise oriented (rotated 90 degrees or at other orientations) and the spatially relative descriptors used herein interpreted accordingly.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first "element," "component," "region," "layer," or "section" could be termed a second element, component, region, layer, or section without departing from the teachings herein.

Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The etchant composition described herein may be used to form a metal wiring by etching a metal layer formed on a substrate. The metal layer includes copper and titanium and may be a dual-layered metal film. As used herein, the term "dual-layered" refers to structure having two layers. In particular, the etchant composition may be used to etch a dual-layered metal film including a titanium metal layer formed of titanium and a copper metal layer formed of copper.

The etchant composition according to the embodiments of the present invention includes persulfate, a fluoride compound, an inorganic acid, a cyclic amine compound, a compound having an amino group and a sulfonic acid group, and an organic acid or a salt thereof.

The persulfate included in the etchant composition is the main oxidation agent present in the etchant composition and is capable of etching a titanium layer and a copper layer simultaneously. The persulfate is present in an amount of about 0.5 weight % to about 20 weight % with respect to the total weight of the etchant composition. If the amount of the persulfate in the etchant composition is less than about 0.5 weight %, the etching rate is reduced and the etching may not be sufficient. If the amount of the persulfate in the etchant composition is higher than about 20 weight %, the etching rate is excessively fast and it is difficult to control the extent of etching that occurs. Accordingly, if the amount of persulfate is too high, the titanium layer and the copper layer may be over-etched.

The persulfate may include at least one of potassium persulfate ($K_2S_2O_8$), sodium persulfate ($Na_2S_2O_8$), and ammonium persulfate (($NH_4)_2S_2O_8$).

The fluoride compound included in the etchant composition is a compound comprising fluoride, and is present in an amount of about 0.01 weight % to about 2 weight % with respect to the total weight of the etchant composition. If the amount of the fluoride compound in the etchant composition is less than 0.01 weight %, the etching speed of a metal layer including titanium is greatly reduced, and thus, it is difficult to maintain the appropriate etching time and as a result, a residue may be generated. If the amount of the fluoride compound in the etchant composition is higher than 2 weight %, the substrate, such as glass, and the insulating layer including silicon may be damaged.

The fluoride compound is a compound that may be dissociated into fluoride ions or polyatomic fluoride ions. The fluoride compound may be at least one of ammonium fluoride, sodium fluoride, potassium fluoride, ammonium bifluoride, sodium bifluoride, and potassium bifluoride.

The ammonium fluoride may be used to control arsenic (As), which is a regulated substance in the fluoride compound.

The presence of the inorganic acid in the etchant composition adjusts the pH of the etchant composition and thereby provides an environment in which the copper-based metal layer may be etched and restrains the decomposition of the persulfate by reducing the pH of the etchant composition. The amount inorganic acid in the etchant composition is about 1 weight % to about 10 weight % with respect to the total weight of the etchant composition. If the amount of the inorganic acid in the etchant composition is less than 1 weight %, the ability of the inorganic acid to adjust the pH is degraded, and thus, decomposition of the persulfate is accelerated and the etching property of copper may be greatly degraded. If the amount of the inorganic acid in the etchant composition is greater than 10 weight %, the etching speed of the copper is increased and cracks may be generated in the photosensitive layer. As a result, when the photosensitive layer is peeled off, the titanium layer or the copper layer positioned beneath the cracked photosensitive layer is excessively etched.

The inorganic acid may be at least one of nitric acid, sulphuric acid, phosphoric acid, and perchloric acid.

The cyclic amine compound included in the etchant composition is an anti-corrosion agent. The cyclic amine compound adjusts the etching speed of the copper-based metal thereby reducing the cut dimension (CD) loss of patterns and increasing the processing margin. The cyclic amine compound is present in an amount of about 0.1 weight % to about 5.0 weight % with respect to the total weight of the etchant composition. If the amount of the cyclic amine compound in the etchant composition is less than 0.1 weight %, a significant amount of CD loss may occur. If the amount of the cyclic amine compound in the etchant composition is greater than 5 weight %, the etching speed of the copper is too slow. Accordingly, it is difficult to obtain a CD skew within a desired time period.

The cyclic amine compound may be at least one of aminotetrazole, imidazole, indole, purine, pyrazole, pyridine, pyrimidine, pyrrole, pyrrolidine, and pyrroline.

The compound having the amino group and the sulfonic acid group included in the etchant composition is an additive for preventing aging. The compound having the amino group and the sulfonic acid group is dissociated into sulphate ions ($SO_4^{2-}$) in the etchant composition to slow the hydrolysis speed of the persulfate, and to prevent an increase in the instability in the etching rate of the copper and titanium associated with an increase in the number of processed substrates in the etchant composition. Moreover, phenol and phenolic derivatives, which are regulated substances detected using conventional aromatic sulfonic acid, are not detected, and thus, an eco-friendly etchant is provided.

The compound having the amino group and the sulfonic acid group is present in an amount of about 0.1 weight % to about 10.0 weight % with respect to the total weight of the etchant composition.

The compound having an amino group and the sulfonic acid group simultaneously may be expressed by following chemical formula 1:

Formula 1

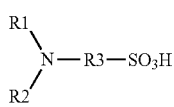

Formula (1)

In the above chemical formula, R1 and R2 are independently a hydrogen, or a C1 to C3 alkyl group, and R3 is a direct bond or a C1 to C3 alkylene group.

The compound having the amino group and the sulfonic acid group may be at least one of sulfamic acid and aminoethanesulfonic acid.

The organic acid or salts thereof contained in the etchant composition is adsorbed on the copper-based surface of the metal layer to affect the improvement in etching uniformity and increase in solubility, thereby improving the etching speed and the etching capability.

The organic acid or salts thereof is present in an amount of about 0.1 weight % to about 12 weight % with respect to the total weight of the etchant composition. The organic acid or the salt thereof functions to chelate copper ions and form a complex thereof in the etchant composition, thereby adjusting the etching speed of the copper. If the amount of the organic acid in the etchant composition is less than about 0.1 weight %, it is difficult to adjust the etching speed of the copper, and thus, over-etching of the copper may result. If the amount of the organic acid in the etchant composition is greater than about 12 weight %, the etching speed of the copper is reduced, and thus, the etching time required to complete the process increases. Accordingly, the number of substrates that may be processed is also reduced. Thus, the organic acid may be present in an amount of about 5 weight % to about 10 weight %, with respect to the total weight of the etchant composition.

In the etchant composition, the organic acid is at least one of carboxylic acid, dicarboxylic acid or tricarboxylic acid, or tetracarboxylic acid, for example, acetic acid, butanoic acid, citric acid, formic acid, gluconic acid, glycolic acid, malonic acid, oxalic acid, pentanoic acid, sulfobenzoic acid, sulfosuccinic acid, sulfophthalic acid, salicylic acid, sulfosalicylic acid, benzoic acid, lactic acid, glyceric acid, succinic acid, malic acid, tartaric acid, isocitric acid, propenoic acid, iminodiacetic acid, and ethylenediaminetetraacetic acid (EDTA).

The organic acid salt may be at least one of a potassium salt, a sodium salt, and an ammonium salt of the above organic acids.

In addition to the above components, the etchant composition may further include an additional etching adjuster, a surfactant, and a pH adjuster.

The etchant composition may contain water in a sufficient amount so that the total weight of the etchant composition becomes 100 weight %. The water may be deionized water.

In various embodiments, the etchant composition is used in processes of manufacturing electronic devices, and in particular, may be used to etch metal layers arranged on a substrate during the manufacturing processes of the electronic devices. In an exemplary embodiment, the etchant composition may be used to etch a metal layer having a dual-layer structure formed of titanium and copper, to form a gate wiring.

The etchant composition of the present invention has a slower aging property than that of a prior art compositions. In prior art etchant compositions, decomposition occurs in the etchant composition and the concentration of the oxidation agent in the etchant composition is reduced. Accordingly, the etching characteristics of the prior art etchant composition, for example, the etching rate, the tapered angle, and the cut dimension (CD) loss may not be consistently maintained.

However, according to the etchant composition the present invention, the sulfonic acid is added as a material for reducing the aging of the etchant composition. Accordingly, the number of substrates that may be processed by the etchant composition per unit time is increased, and uniform etching results may therefore be obtained.

In particular, when the metal wiring having the titanium layer and the copper layer is etched by using the etchant composition of the present invention, a metal wiring having a tapered angle (θ) of about 50° may be obtained. The tapered angle will be described later in a comparative example.

FIGS. 1 through 5 are cross-sectional views illustrating an exemplary embodiment of a method of forming a metal wiring using an etchant composition.

Referring to FIG. 1, a metal layer is formed on an insulating substrate INS. The metal layer may have a dual-layered structure including a first metal layer CL1 formed of a first metal and a second metal layer CL2 formed of a second metal that is different from the first metal. Herein, the first metal may be titanium and the second metal may be copper. While the metal layer illustrated in FIGS. 1 to 5 has a dual-layered structure, the present invention is not limited thereto, and the metal layer may be a single layer formed of an alloy including the first metal and the second metal, or a multi-layer structure having three or more layers in which the first metal layer CL1 and the second metal layer CL2 are alternately stacked.

Figure 2:
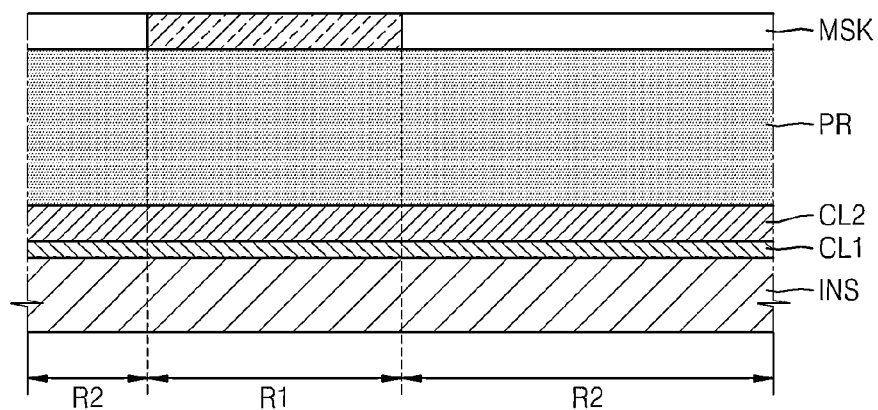

Next, as shown in FIG. 2, a photosensitive layer PR is formed on the entire surface of the insulating substrate INS. A mask MSK is placed on the photosensitive layer PR and then, the photosensitive layer PR is exposed to irradiated light. The mask MSK includes a first region R1 blocking all irradiated light, and a second region R2 transmitting some of the light and blocking some of the light. The upper surface of the insulating substrate INS is divided into regions corresponding to the first region R1 and the second region R2, and the corresponding regions of the insulating substrate INS will also be referred to as the first region R1 and the second region R2.

Figure 3:
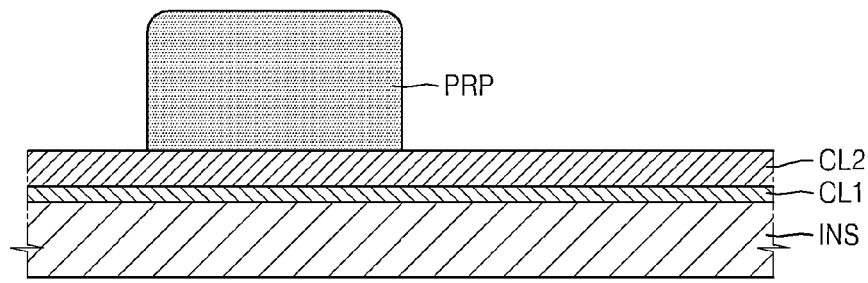

The portions of photosensitive layer PR exposed to irradiated light via the mask MSK are developed. As shown in FIG. 3, a photosensitive layer pattern PRP having a predetermined thickness remains on the region where the light is blocked by the mask MSK in the first region R1, and the photosensitive layer PR is completely removed in the second region R2 where the light is transmitted through the mask MSK and the surface of the insulating substrate INS is exposed. Herein, a positive photoresist is used so that the photosensitive layer PR on the exposed region of the insulating substrate INS is removed, however, the present invention is not limited thereto. A negative photoresist may also be used so that the photosensitive layer PR on a region that is not exposed may be removed.

Figure 4:
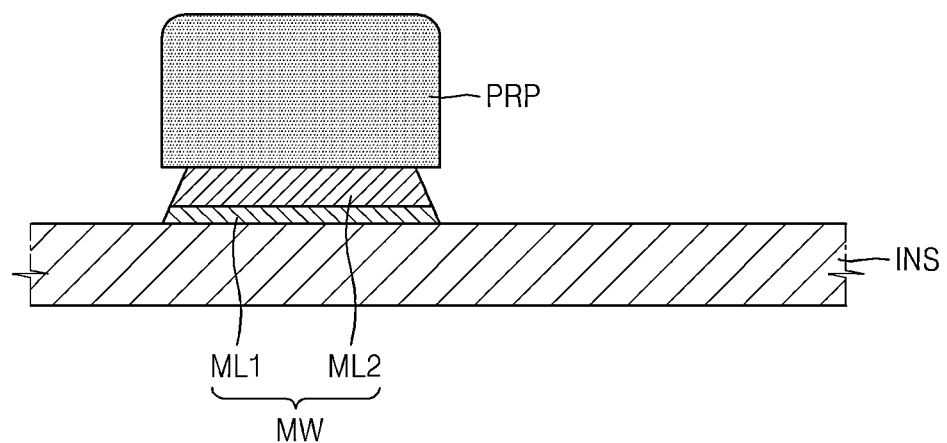

Next, as shown in FIG. 4, the first metal layer CL1 and the second metal layer CL2 formed under the photosensitive layer pattern PRP are etched using the photosensitive layer pattern PRP as a mask. In the process of etching the first metal layer CL1 and the second metal layer CL2, the etchant composition of the present invention is used.

Figure 5:
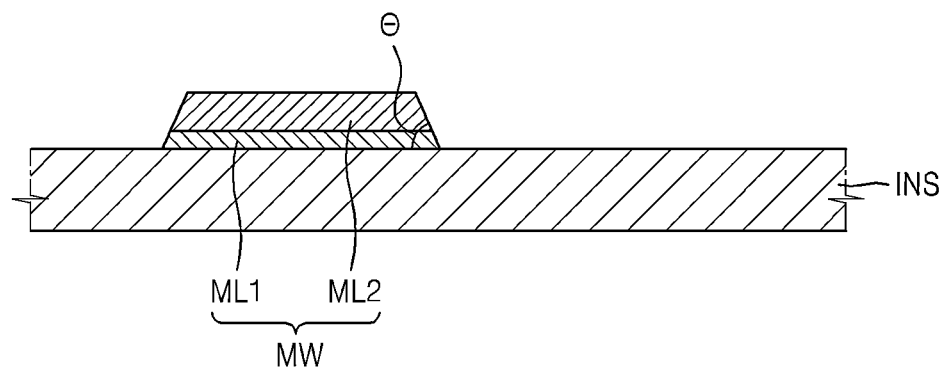

As a result of the above processes, a metal wiring MW is formed having a structure in which a first metal line ML1 formed of the first metal and a second metal line ML2 formed of the second metal are stacked and are in the form of a dual-layer. After that, as shown in FIG. 5, the remaining photosensitive layer pattern PRP is removed, thereby completing the forming of the metal wiring MW.

Through the above-described processes, the metal wiring MW formed of the first metal and the second metal, that is, a titanium/copper metal wiring, may be manufactured.

According to the embodiments of the present invention, a display apparatus may be manufactured using the method of fabricating the metal wiring described above. The structure of the display apparatus will be described below while the method of manufacturing the display apparatus will be described later.

Figure 6:
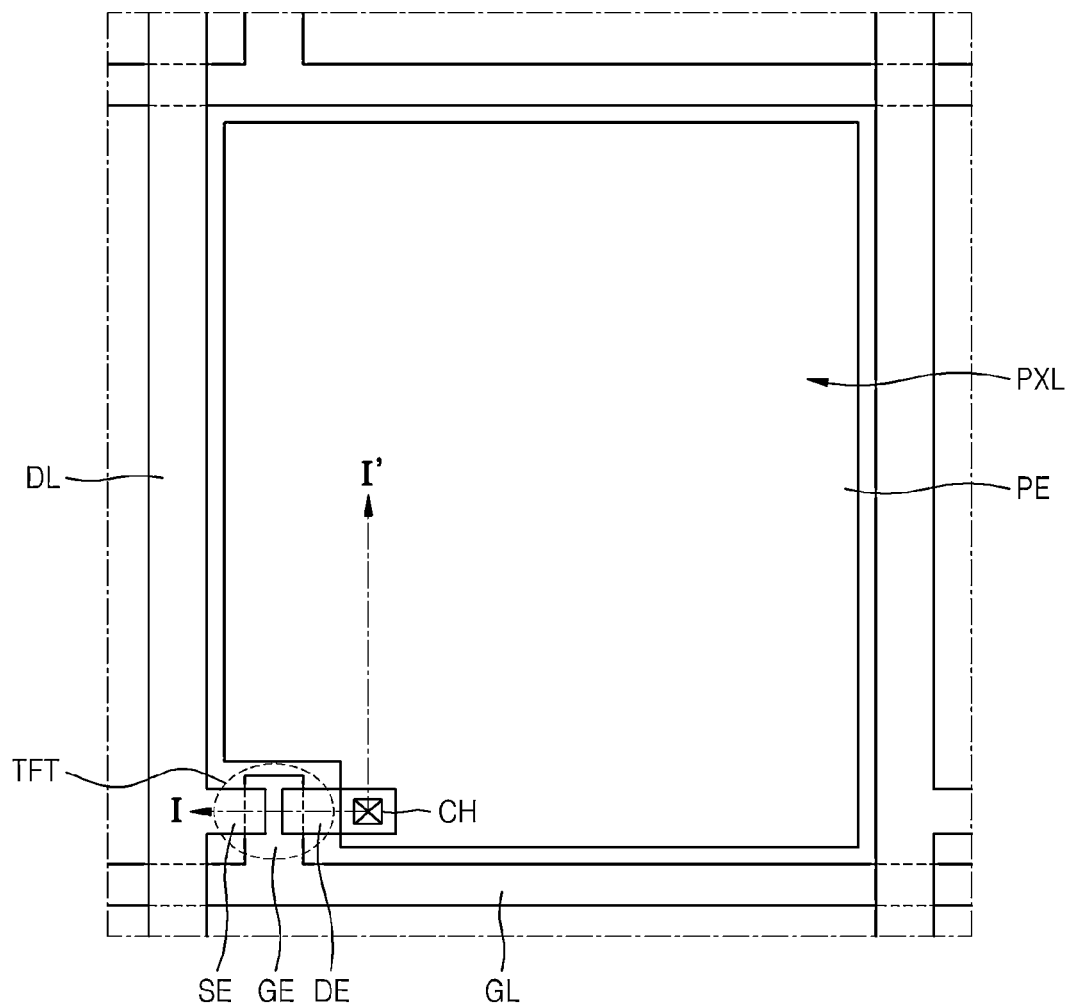
FIG. 6 is a plan view illustrating a display apparatus including an embodiment of a thin film transistor (TFT) substrate manufactured using the etchant composition according to the present invention.
Figure 7:
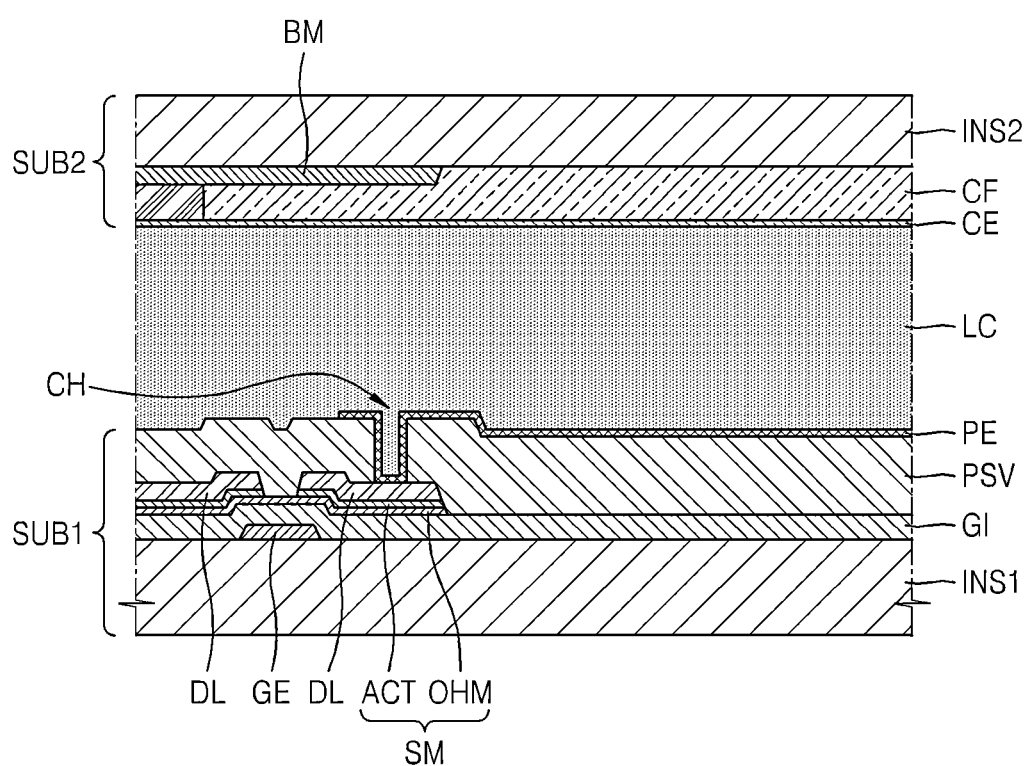
FIG. 7 is a cross-sectional view of the display apparatus taken along line I-I' of the apparatus illustrated in FIG. 6.

FIG. 6 is a plan view of a display apparatus including an exemplary embodiment of a thin film transistor (TFT) substrate that may be fabricated using the etchant composition of the present invention. FIG. 7 is a cross-sectional view of the display apparatus taken along line I-I' of FIG. 6. The TFT substrate is used in a display apparatus.

The display apparatus includes a plurality of pixels for displaying images. The display apparatus is not particularly limited. For example, the display apparatus may include various kinds of display apparatus such as a liquid crystal display ("LCD") panel, an organic light emitting display ("OLED") apparatus, an electrophoretic display apparatus, an electrowetting display apparatus, and a microelectromechanical system ("MEMS") display apparatus. In an embodiment of the present invention, a liquid crystal display apparatus is described as an example. In this context, pixels have the same structures, and thus, a pixel and a gate line GL and a data line DL that are adjacent to the pixel will be described for convenience of description.

Referring to FIGS. 6 and 7, the display apparatus of the present embodiment includes a first display substrate SUB1 including pixels PXL, a second display substrate SUB2 facing the first display substrate SUB1, and a liquid crystal layer LC formed between the first and the second display substrates SUB1 and SUB2. Herein, the TFT substrate also refers to the first display substrate SUB1, for example.

The first display substrate SUB1 includes a first insulating substrate INS1, and a plurality of gate lines GL and a plurality of data lines DL formed on the first insulating substrate INS1. The gate lines GL extend in a first direction on the first insulating substrate INS1. The data lines DL are formed on a gate insulating layer GI and extend in a second direction crossing the first direction, such that the data lines DL crosses the gate line GL.

Each of the pixels PXL is connected to one of the gate lines GL and one of the data lines DL. Each of the pixels PXL includes a TFT and a pixel electrode PE connected to the TFT.

The TFT may include a gate electrode GE, a semiconductor layer SM, a source electrode SE, and a drain electrode DE.

The gate electrode GE may protrude from the gate line GL.

The semiconductor layer SM is located on the gate electrode GE with the gate insulating layer GI between the semiconductor layer SM and the gate electrode GE. The semiconductor layer SM includes an active layer ACT on the gate insulating layer GI and an ohmic contact layer OHM on the active layer ACT. The active layer ACT is formed to correspond to regions where the source electrode SE and the drain electrode DE are formed. The region between the source electrode SE and the drain electrode DE are on a plane. The ohmic contact layer OHM is formed between the active layer ACT and the source electrode SE and between the active layer ACT and the drain electrode DE.

The source electrode SE is branched from the data line DL, and at least a part of the source electrode SE overlaps with the gate electrode GE when it is seen from above. The drain electrode DE is separated from the source electrode SE, and at least a part of the drain electrode DE overlaps with the gate electrode GE when it is viewed from the above.

The pixel electrode PE is connected to the drain electrode DE via a passivation layer PSV formed between the pixel electrode PE and the drain electrode DE. The passivation layer PSV has a contact hole CH that exposes a part of the drain electrode DE, and the pixel electrode PE is connected to the drain electrode DE via the contact hole CH.

The second display substrate SUB2 is formed to face the first display substrate SUB1. The second display substrate SUB2 includes a second insulating substrate INS2, a color filter CF formed on the second insulating substrate INS2 to represent colors, a black matrix BM disposed around the color filter CF to block light, and a common electrode CE forming an electric field with the pixel electrode PE.

Figure 8:
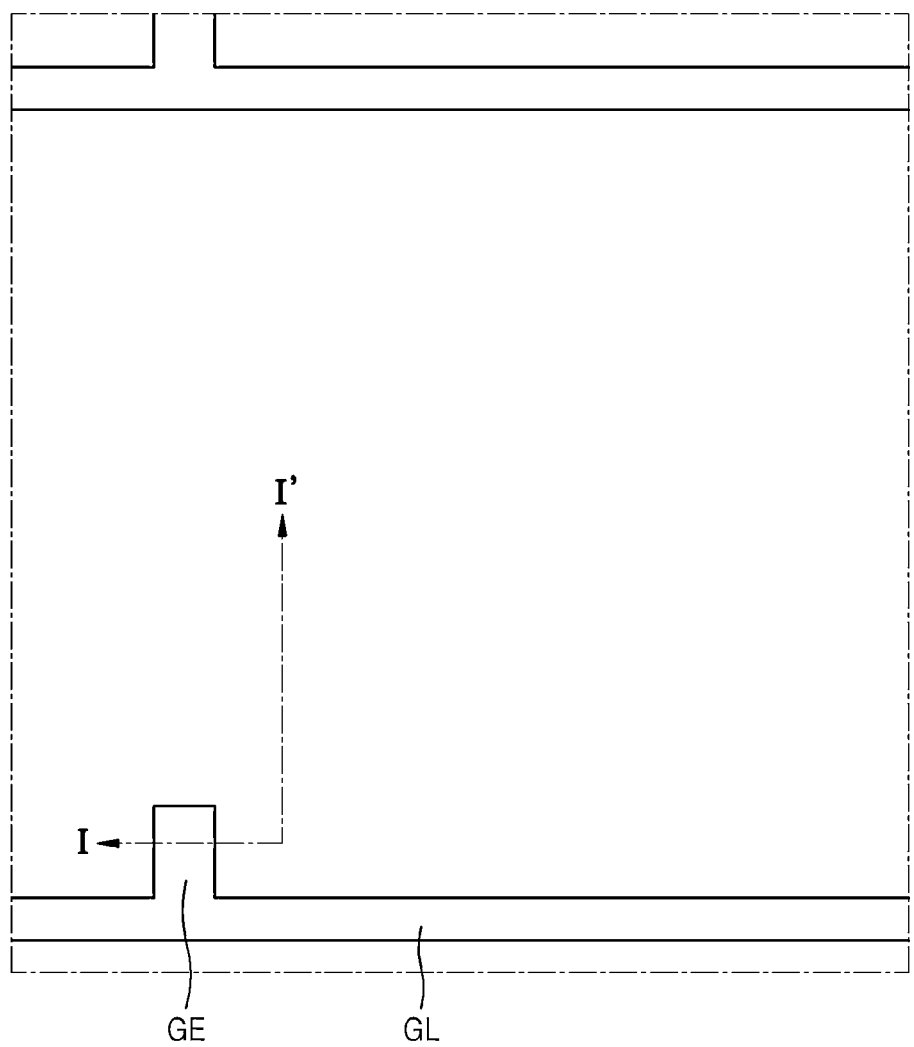
FIGS. 8 through 10 are plan views illustrating processes of manufacturing the TFT substrate included in the display apparatus of FIG. 6.
Figure 9:
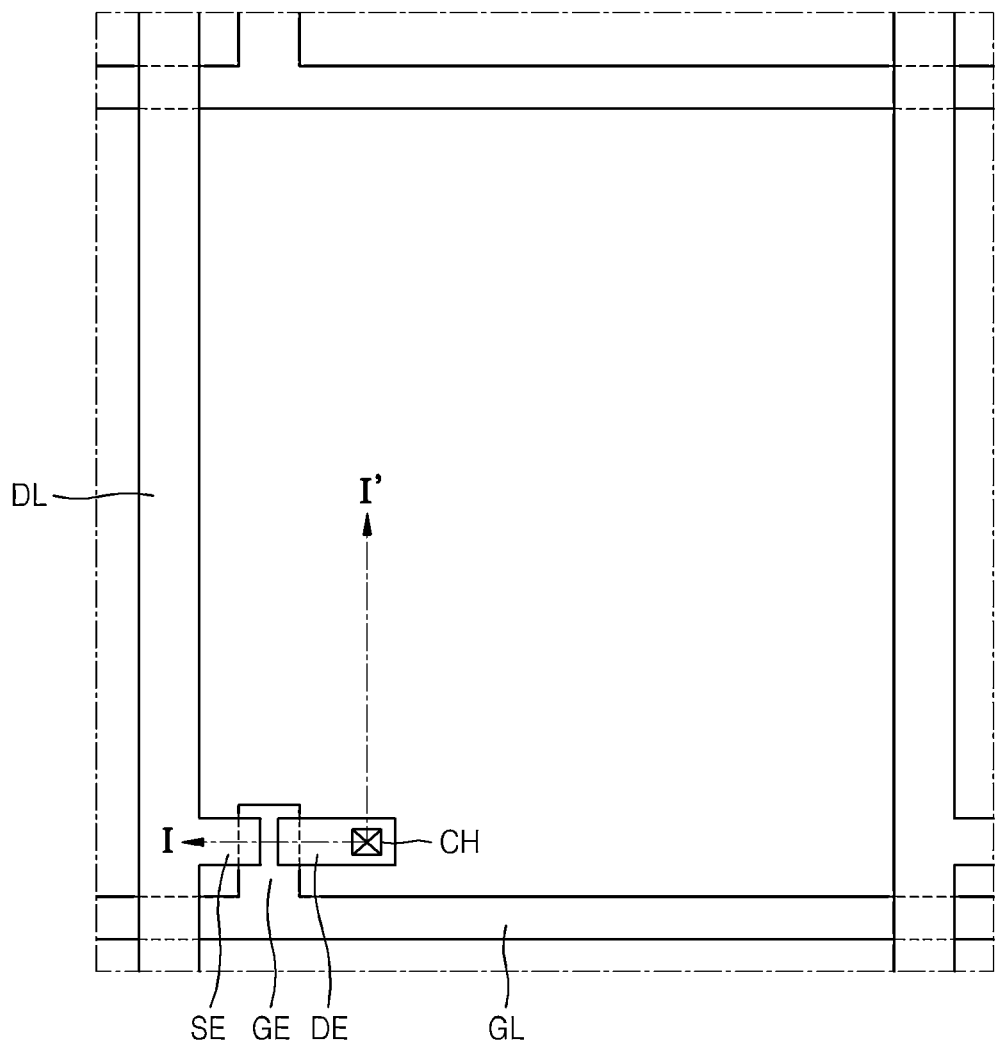
Figure 10:
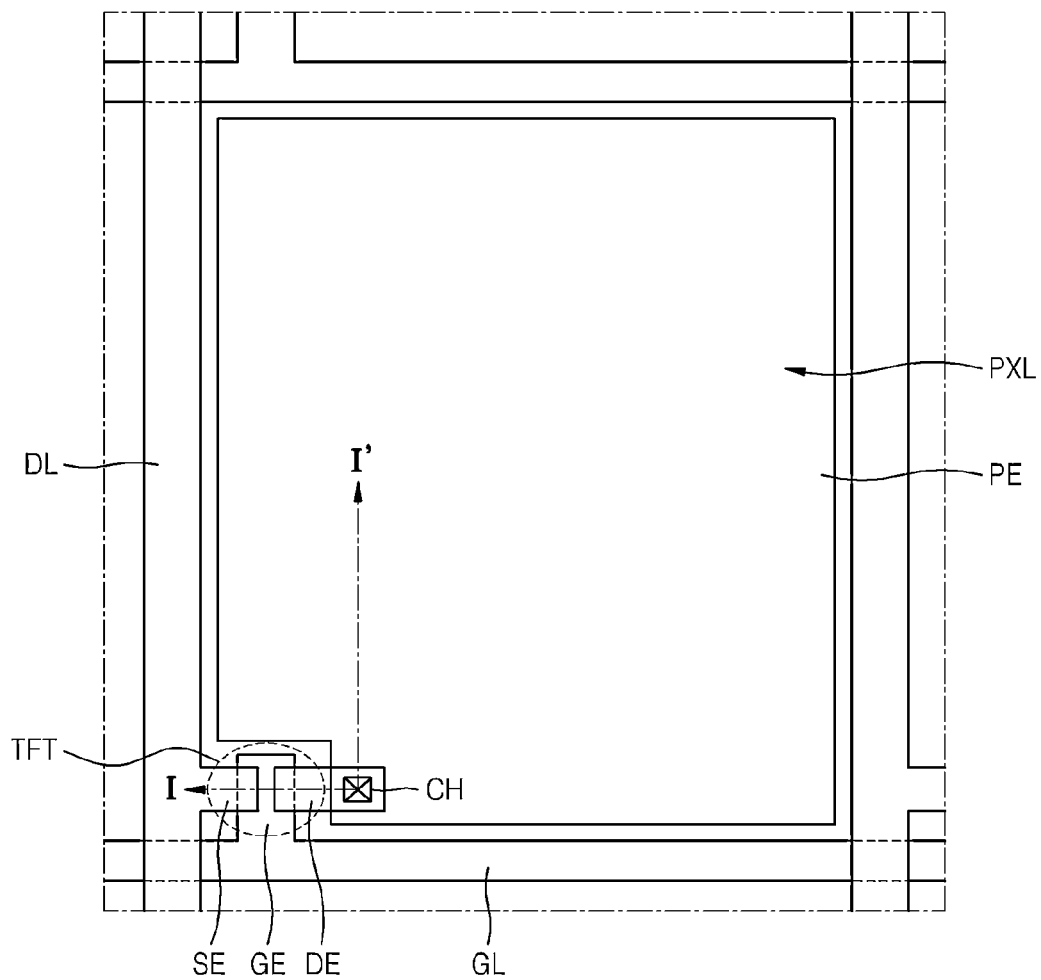
Figure 11:
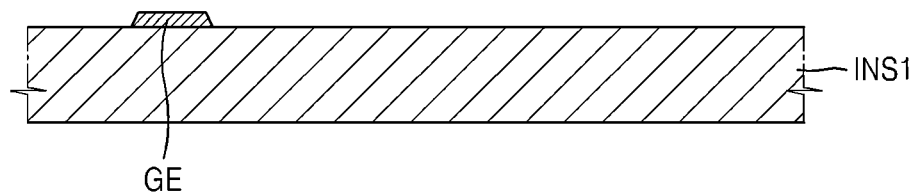
FIGS. 11 through 13 are cross-sectional views of the TFT substrate taken along line I-I' of TFT substrate illustrated in FIGS. 8 through 10.
Figure 12:
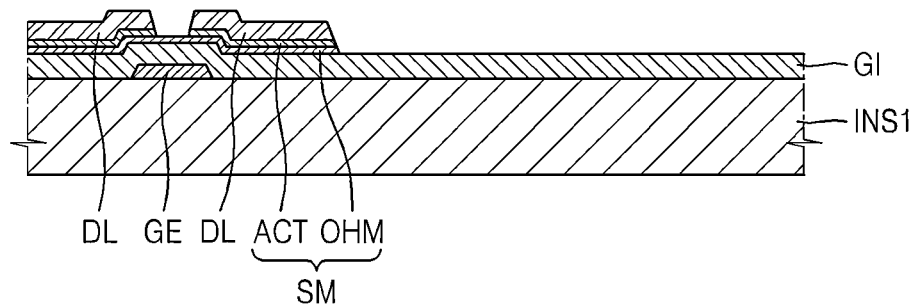
Figure 13:
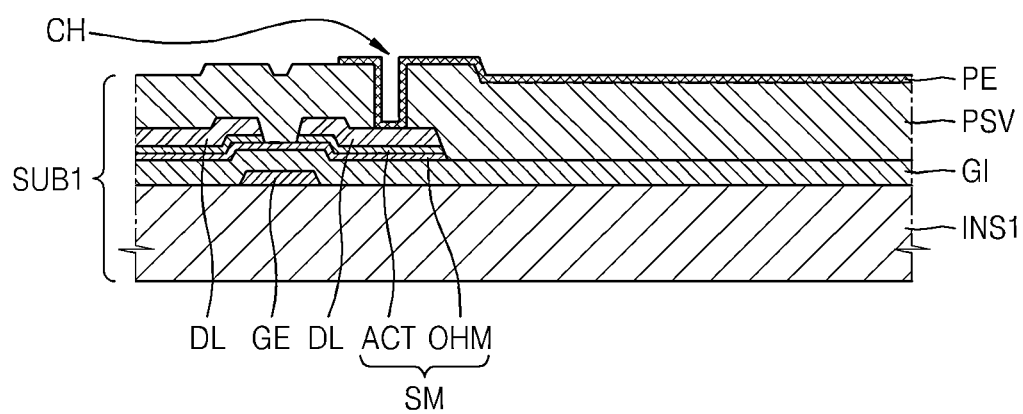

FIGS. 8 through 10 are plan views illustrating processes of manufacturing the TFT substrate included in the display apparatus of FIG. 7. FIGS. 11 through 13 are cross-sectional views of taken along line I-I' of FIGS. 8 through 10.

A method of manufacturing a display apparatus, according to an embodiment of the present invention, will be described herein with reference to FIGS. 8 through 10 and FIGS. 11 through 13.

Referring to FIGS. 8 and 11, a first wiring unit is formed on the first insulating substrate INS1 using a first photolithography process. The first wiring unit includes a gate line GL extending in the first direction, and a gate electrode GE connected to the gate line GL.

The gate line GL may be formed by sequentially stacking a first metal and a second metal on the first insulating substrate INS1 to form a first metal layer and a second metal layer, where the second metal layer is disposed on the first metal layer, and by etching the first metal layer and the second metal layer by using a first mask (not shown). The first metal layer may be formed of titanium, and the second metal layer may be formed of copper. Here, the first metal layer may be formed to a thickness of about 50 Angstroms (Å) to about 300 Å, and the second metal layer may be formed to a thickness of about 2000 Å to about 5000 Å. The first metal layer and the second metal layer are etched using the etchant composition of the present invention. Here, the first wiring unit may be etched so that the tapered angle may be about 25° to about 50°. The tapered angle denotes the angle between a side surface of the metal wiring and an upper surface of the insulating substrate. Accordingly, the gate line GL and the gate electrode GE may be formed to have dual-layered structures, in which the first metal and the second metal are sequentially stacked.

Referring to FIGS. 9 and 12, a gate insulating layer is formed on the first insulating substrate INS1 on which the first wiring unit is formed, and a semiconductor pattern and a second wiring unit are formed on the first insulating substrate INS1 on which the gate insulating layer GI is formed. The second wiring unit may include a data line DL extending in the second direction that crosses the first direction along which the gate line GL extends, a source electrode SE extending from the data line DL, and a drain electrode DE separated from the source electrode SE.

The gate insulating layer GI is formed by stacking (layering) a first insulating material on the first insulating substrate INS1 on which the first wiring unit is formed.

The second wiring unit is formed by sequentially stacking a first semiconductor material, a second semiconductor material, and a third conductive material on the first insulating substrate INS1, and selectively etching a first semiconductor layer (not shown), a second semiconductor layer (not shown), and a third conductive layer (not shown). The first, second and third conductive layers are respectively formed of the first semiconductor material, the second semiconductor material, and the third conductive material by using a second mask (not shown). The second mask may be a slit mask or a diffraction mask.

The third conductive material may be a metal material such as copper, molybdenum, aluminium, tungsten, chrome, or titanium, or an alloy including at least one of the above metal materials. When etching the first conductive layer, a predetermined etchant composition is used that is suitable for the type of metal used to form the third conductive layer. The etchant composition used for etching the etching the first conductive layer may be different from the etchant composition that is used when forming the first wiring unit, so that the tapered angle of the third conductive layer is greater than the tapered angle of the first wiring unit.

Referring to FIGS. 10 and 13, the passivation layer PSV having the contact hole CH that exposes a part of the drain electrode DE is formed on the first insulating substrate INS1, on which the second wiring unit is formed, using a third photolithography process. The passivation layer PSV may be formed using a second insulation material (not shown) and a photosensitive layer (not shown). The passivation layer is formed by stacking the second insulating material layer on the first insulating substrate INS1 on which the second wiring unit is formed, using the photosensitive layer pattern as a mask, exposing and developing the photosensitive layer to form a photosensitive layer pattern (not shown), and removing a part of the second insulating material.

Referring back to FIG. 13, a pixel electrode PE provided on the passivation layer PSV and connected to the drain electrode DE via the contact hole CH is formed by using a fourth photolithography process. The pixel electrode PE may be formed by sequentially stacking a transparent conductive material layer (not shown) and a photosensitive layer (not shown) on the first insulating layer INS1 on which the passivation layer PSV is formed, exposing and developing the photosensitive layer to form a photosensitive layer pattern (not shown), and patterning the transparent conductive material layer using the photosensitive layer pattern as a mask.

The TFT substrate manufactured by the above-described processes, that is, the first display substrate SUB1, is bonded to the second display substrate SUB2 on which a color filter layer is formed. The liquid crystal layer LC is formed between the first display substrate SUB1 and the second display substrate SUB2.

An embodiment is described in further detail with reference to the following Examples. The Examples are presented herein for illustrative purpose only, and do not limit the scope of the present disclosure.

EXAMPLES

Experimental Example

When the metal wiring is formed by using the etchant compositions shown in Table 1 below, glass and photoresist (PR) damage may be reduced, and thus, shortage defects of the first wiring unit may be reduced. Also, ammonium fluoride and sulfamic acid (i.e. a compound having an amino group and a sulfonic acid) are used, and thus, arsenic and phenols that are regulated substances are not present. Thus, environmental limitations associated with the use of the disclosed etchant composition may be minimized.

Figure 14:
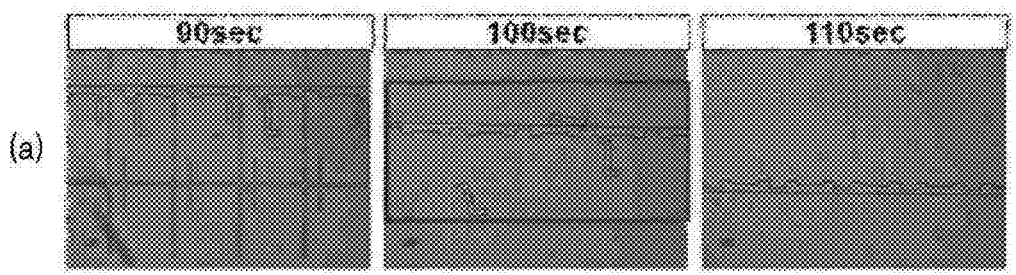
FIG. 14 shows optical images showing the results of a photoresist (PR) lifting test conducted with (a) experimental example 1 and (b) comparative example 1.
Figure 14:
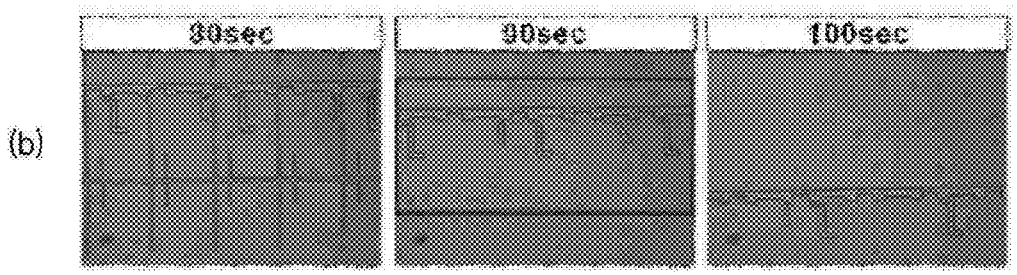

Table 1 provides a comparison of the etchant damage results between a comparative example 1 (CE 1) and an experimental example 1 (Ex. 1). First, FIG. 14 shows results of PR lifting tests, in which times of isolating the PR are compared. The PR lifting tests were conducting using a photoresist having a pattern formed on a glass substrate and dipped in an etchant composition at a constant temperature (28° C.). In FIG. 14, (a) illustrates the result obtained using the etchant composition of experimental example 1, and (b) illustrates the result obtained using the etchant composition of the comparative example 1.

Figure 15:
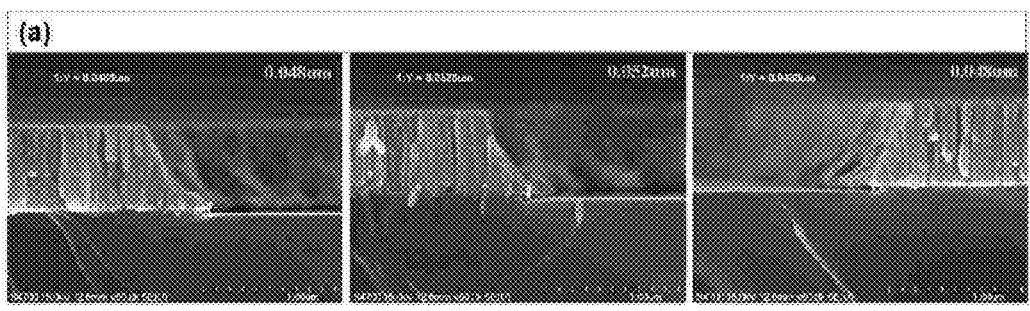
FIG. 15 shows SEM images showing the results of a glass damage test conducted with (a) experimental example 1 and (b) comparative example 1.
Figure 15:

FIG. 15 includes SEM images showing the results of the glass damage test. The glass damage tests were conducted using a substrate in which a predetermined metal was patterned on glass, etched for a predetermined time period, and then, the depth profiles of glass damage were compared using an evaluation device (SEM imaging). In FIG. 15, (a) illustrates the result obtained using the etchant composition of experimental example 1, and (b) illustrates the result obtained using the etchant composition of the comparative example 1. By evaluating the glass damage, the degree of erosion due to the etchant was assessed as increased or not. That is, the PR lifting time of the experimental example 1 was longer than that of the comparative example 1, and thus, the disconnection defects in the metal wiring may be improved.

Figure 16:
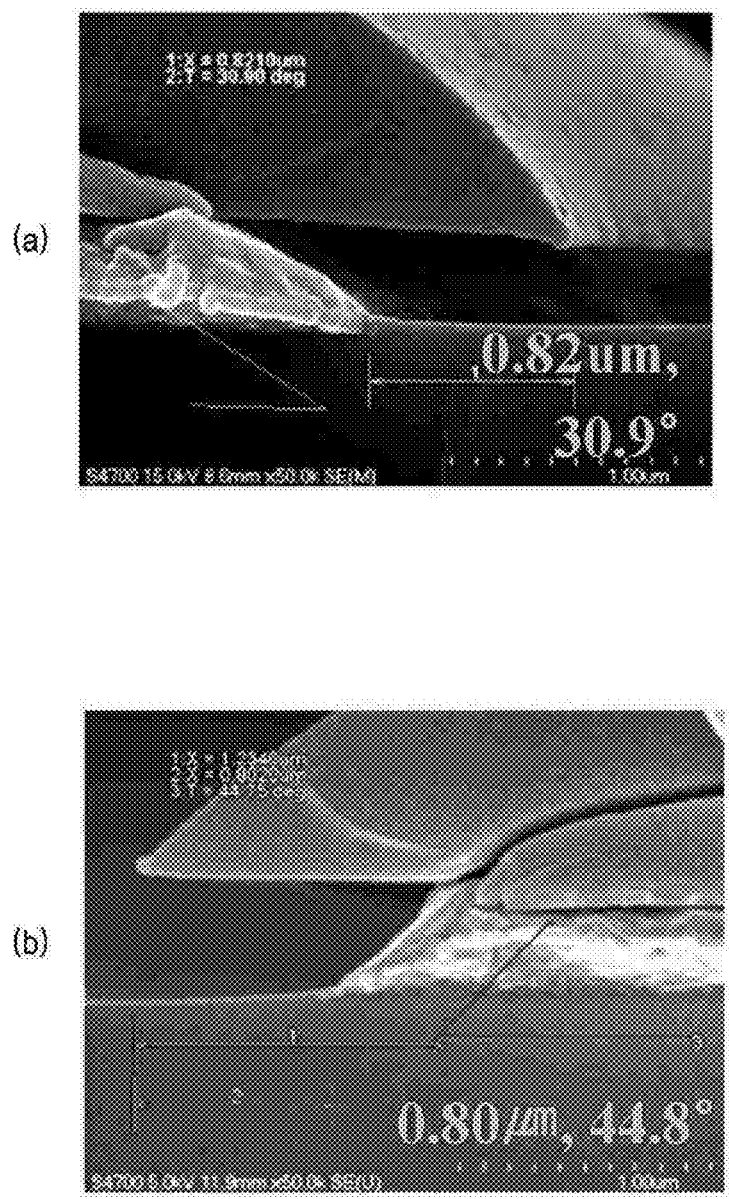
FIG. 16 shows SEM images showing the results of an etch test conducted with (a) experimental example 1 and (b) comparative example 1.

Also, when forming a gate metal wiring of a TFT for a flat panel display (FPD), the upper deposition density is affected by the size of the tapered angle (T/A) of metal. When the T/A is increased, cracks and disconnection increase in a step region of the deposition layer. FIG. 16 shows SEM images of the results of an etch test conducted using experimental example 1 (a) and (b) comparative example 1(b). As shown in FIG. 16, the T/A of experimental example 1 is relatively lower than the T/A of comparative example 1. Therefore, to address the above problem associated with increased T/A, the present embodiment (a) may have a relatively lower T/A than that of the comparative example 1 (b), which is shown in FIG. 16.

In addition, it should also be noted that arsenic and phenols, which are regulated substances, were detected in the comparative example 1. However, since the ammonium fluoride and an aliphatic amine sulfonic acid were used in the etchant composition of experimental example 1, the arsenic and phenols were not present in the etchant composition.

TABLE 1

| | Composition | | | | | | | | | Environment | | Product characteristics | | |
|---|---|---|---|---|---|---|---|---|---|---|---|---|---|---|
| | Persulfate | Ammonium bifluoride | Ammonium fluoride | Inorganic acid | Cyclic amine compound | Cyclic sulfonic acid | Non-cyclic sulfonic acid | Organic acid | D.I | phenols | As | Glass Damage (Å/Sec) | PR Lifting (Å/Sec) | T/A (°) |
| CE 1 | O | O | — | O | O | O | — | O | O | O | O | 8.4 | 90 | 44.8 |
| Ex. 1 | O | — | O | O | O | — | O | O | O | — | — | 8.2 | 100 | 30.9 |

In Table 1, "O" denotes addition, and "—" denotes non-addition.

Cyclic sulfonic acid is a phenol inductive substance. As mentioned previously, phenol is a regulated substance due to environmental issues. Table 2 shows that there is a variation in the number of Cu/Ti substrates that can be treated with etchant when the conventional cyclic sulfonic acid is not used, in order to exclude the conventional cyclic sulfonic acid.

In Table 2, according to comparative example 1, when the cyclic sulfonic acid that is a phenol inductive substance is used, the accumulated concentration of Cu that may be etched is 5000 ppm or greater. However, when the cyclic sulfonic acid is excluded from the etchant so as not to detect the phenols, the accumulated concentration of Cu is 2000 ppm or less (comparative examples 2), and thus, the etching performance is greatly reduced. This may represent the function of the sulfonic acid as described above. However, when using methane sulfonic acid (comparative example 3) that is not a phenol inductive substance, the accumulated concentration of Cu is reduced to 3000 ppm or less. Thus, the methane sulfonic acid may not substitute for the conventional cyclic sulfonic acid. However, when sulfamic acid is used (experimental example 1), the accumulated concentration of Cu is 5000 ppm. Thus, the use of sulfamic acid in the etchant composition, results in an equivalent etching performance as cyclic sulfonic acid. At the same time, the phenols and arsenic that are regulated substances are not detected in etchant compositions containing sulfamic acid.

TABLE 2

| | composition | | | | | Non-cyclic sulfonic acid | | | | Accumulated evaluation (Cu concentration) |
|---|---|---|---|---|---|---|---|---|---|---|
| | persulfate | Flouride compound | Inorganic acid | Cyclic amine compound | Cyclic sulfonic acid | Methane sulfonic acid | Sulfamic acid | Organic acid | D.I | |
| CE1 | O | O | O | O | O | | | O | O | 5000 ppm or greater |
| CE2 | O | O | O | O | | | | O | O | 2000 ppm or less |
| CE3 | O | O | O | O | | O | | O | O | 3000 ppm or less |
| Ex. 1 | O | O | O | O | | | O | O | O | About 5000 ppm |

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An etchant composition comprising:
   0.5 weight % to 20 weight % of persulfate,
   0.01 weight % to 2 weight % of a fluoride compound,
   1 weight % to 10 weight % of an inorganic acid, wherein the inorganic acid is at least one of nitric acid, sulphuric acid, phosphoric acid, and perchloric acid,
   0.5 weight % to 5 weight % of a cyclic amine compound,
   0.1 weight % to 10.0 weight % of a compound having an amino group and a sulfonic acid,
   0.1 weight % to 15.0 weight % of an organic acid or a salt thereof, and
   water to a total of 100 weight % of the etchant composition, wherein the weight percents are based on a total weight of the etchant composition.

2. The etchant composition of claim 1, wherein the persulfate is at least one of potassium persulfate ($K_2S_2O_8$), sodium persulfate ($Na_2S_2O_8$), and ammonium persulfate (($NH_4$)$_2S_2O_8$).

3. The etchant composition of claim 1, wherein the fluoride compound is at least one of ammonium fluoride, sodium fluoride, potassium fluoride, ammonium bifluoride, sodium bifluoride, and potassium bifluoride.

4. The etchant composition of claim 1, wherein the cyclic amine compound is at least one of aminotetrazole, imidazole, indole, purine, pyrazole, pyridine, pyrimidine, pyrrole, pyrrolidine, and pyrroline.

5. The etchant composition of claim 1, wherein the compound having the amino group and the sulfonic acid group is represented by the following chemical Formula 1:

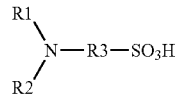

Formula 1 where R1 and R2 are independently selected from hydrogen, and a C1 to C3 alkyl group, and R3 is a bond or a C1 to C3 alkylene group.

6. The etchant composition of claim 5, wherein the compound having the amino group and the sulfonic acid group is sulfamic acid or aminoethanesulfonic acid.

7. The etchant composition of claim 1, wherein the organic acid is at least one of carboxylic acid, dicarboxylic acid, tricarboxylic acid, and tetracarboxylic acid, and wherein the organic acid salt is a potassium salt, a sodium salt, or an ammonium salt of the organic acid.

8. The etchant composition of claim 1, wherein the organic acid is at least one of acetic acid, butanoic acid, citric acid, formic acid, gluconic acid, glycolic acid, malonic acid, oxalic acid, pentanoic acid, sulfobenzoic acid, sulfosuccinic acid, sulfophthalic acid, salicylic acid, sulfosalicylic acid, benzoic acid, lactic acid, glyceric acid, succinic acid, malic acid, tartaric acid, isocitric acid, propenoic acid, iminodiacetic acid, and ethylenediaminetetraacetic acid (EDTA), and wherein the organic acid salt is a potassium salt, a sodium salt, or an ammonium salt of the organic acid.

9. The etchant composition of claim 1, wherein the etchant composition is capable of etching a multi-layer structure formed of copper and titanium.

10. A method of fabricating a metal wiring, the method comprising:
forming a metal layer comprising copper and titanium on a substrate;
forming a photosensitive layer pattern on the metal layer,
etching a portion of the metal layer with an etchant composition, wherein the photosensitive layer pattern acts as a mask; and
removing the photosensitive layer pattern,
wherein the etchant composition comprises:
0.5 weight % to about 20 weight % of persulfate,
0.01 weight % to 2 weight % of a fluoride compound,
1 weight % to 10 weight % of an inorganic acid, wherein the inorganic acid is at least one of nitric acid, sulphuric acid, phosphoric acid, and perchloric acid,
0.5 weight % to 5 weight % of a cyclic amine compound,
0.1 weight % to 10.0 weight % of a compound having an amino group and a sulfonic acid group,
0.1 weight % to 15.0 weight % of an organic acid or a salt thereof, and
water to a total of 100 weight % of the etchant composition,
wherein the weight percents are based on the total weight of the etchant composition.

11. The method of claim 10, wherein the metal layer comprises a first metal layer formed of titanium and a second metal layer formed of copper, wherein the second metal layer is formed on the first metal layer.

12. The method of claim 11, wherein the persulfate is at least one of potassium persulfate ($K_2S_2O_8$), sodium persulfate ($Na_2S_2O_8$), and ammonium persulfate (($NH_4$)$_2S_2O_8$).

13. The method of claim 11, wherein the cyclic amine compound is at least one of aminotetrazole, imidazole, indole, purine, pyrazole, pyridine, pyrimidine, pyrrole, pyrrolidine, and pyrroline.

14. The method of claim 11, wherein the compound having the amino group and the sulfonic acid group is at least one of sulfamic acid or aminoethanesulfonic acid.

15. The method of claim 11, wherein the organic acid is at least one of a carboxylic acid, a dicarboxylic acid or tricarboxylic acid, and a tetracarboxylic acid, and wherein the organic acid salt is a potassium salt, a sodium salt, or an ammonium salt of the organic acid.

16. The method of claim 11, wherein the organic acid is at least one of acetic acid, butanoic acid, citric acid, formic acid, gluconic acid, glycolic acid, malonic acid, oxalic acid, pentanoic acid, sulfobenzoic acid, sulfosuccinic acid, sulfophthalic acid, salicylic acid, sulfosalicylic acid, benzoic acid, lactic acid, glyceric acid, succinic acid, malic acid, tartaric acid, isocitric acid, propenoic acid, iminodiacetic acid, and ethylenediaminetetraacetic acid (EDTA), and wherein the organic acid salt is a potassium salt, a sodium salt, or an ammonium salt of the organic acid.

17. A method of making a thin film transistor (TFT) substrate, the method comprising:
forming a gate line on a substrate and a gate electrode connected to the gate line, wherein the gate line extends in a first direction;
forming a data line which extends in a second direction, a source electrode connected to the data line, and a drain electrode separated from the source electrode, wherein the data line crosses the gate line; and
forming a pixel electrode connected to the drain electrode,
wherein the forming of the gate line and the gate electrode connected to the gate line comprises:
forming a metal layer including copper and titanium on a substrate;
forming a photosensitive layer pattern on the metal layer, and etching a portion of the metal layer with an etchant composition, wherein the photosensitive layer pattern acts as a mask; and
removing the photosensitive layer pattern,
wherein the etchant composition comprises:
0.5 weight % to about 20 weight % persulfate,
0.01 weight % to 2 weight % of a fluoride compound,
1 weight % to 10 weight % of an inorganic acid, wherein the inorganic acid is at least one of nitric acid, sulphuric acid, phosphoric acid, and perchloric acid,
0.5 weight % to 5 weight % of a cyclic amine compound,
0.1 weight % to 10.0 weight % of a compound having an amino group and a sulfonic acid group,
0.1 weight % to 15.0 weight % of an organic acid or a salt thereof, and
water to a total of 100 weight % of the etchant composition,
wherein the weight percents are based on a total weight of the etchant composition.

18. The method of claim 17, wherein the metal layer comprises a first metal layer formed of the titanium and a second metal layer formed of the copper on the first metal layer.

* * * * *